(12) United States Patent
Ekkanath Madathil

(10) Patent No.: US 6,724,043 B1
(45) Date of Patent: Apr. 20, 2004

(54) BIPOLAR MOSFET DEVICE

(75) Inventor: Sankara Narayanan Ekkanath Madathil, Leicester (GB)

(73) Assignee: De Montfort University, Leicestershire (GB)

(*) Notice: Subject to any disclaimer, the term of this patent is extended or adjusted under 35 U.S.C. 154(b) by 0 days.

(21) Appl. No.: 10/070,513

(22) PCT Filed: Sep. 7, 2000

(86) PCT No.: PCT/GB00/03443

§ 371 (c)(1),
(2), (4) Date: Aug. 22, 2002

(87) PCT Pub. No.: WO01/18876

PCT Pub. Date: Mar. 15, 2001

(30) Foreign Application Priority Data

Sep. 8, 1999 (GB) .............................................. 9921068

(51) Int. Cl.[7] .............................................. H01L 29/76
(52) U.S. Cl. ........................ 257/341; 257/133; 257/146; 257/343; 257/370
(58) Field of Search ................................ 257/341, 343, 257/370, 133, 196, 145

(56) References Cited

U.S. PATENT DOCUMENTS

| | | | |
|---|---|---|---|
| 5,286,981 A | | 2/1994 | Lilja et al. .................. 257/132 |
| 5,319,221 A | | 6/1994 | Ueno .......................... 257/135 |
| 5,493,134 A | * | 2/1996 | Mehrotra et al. ............ 257/132 |
| 5,608,237 A | * | 3/1997 | Aizawa et al. ............... 257/132 |
| 5,879,967 A | * | 3/1999 | Kim ............................. 438/133 |
| 5,925,900 A | * | 7/1999 | Amaratunga et al. ........ 257/147 |
| 5,985,708 A | * | 11/1999 | Nakagawa et al. .......... 438/206 |
| 6,118,141 A | * | 9/2000 | Xu et al. ..................... 257/133 |
| 6,281,546 B1 | * | 8/2001 | Ozeki et al. ................. 257/329 |

* cited by examiner

Primary Examiner—Nathan J. Flynn
Assistant Examiner—Fazli Erdem
(74) Attorney, Agent, or Firm—Darby & Darby

(57) ABSTRACT

There is disclosed a semiconductor device comprising: at least one cell comprising a base region (32) of a first conductivity type having disposed therein at least one emitter region (36a, 36b) of a second conductivity type; a first well region (22) of a second conductivity type; a second well region (2a) of a first conductivity type; a drift region (24) of a second conductivity type; a collector region (14) of a first conductivity type; a collector contact (16) in which each cell is disposed within the first well region (22) and the first well region (22) is disposed within the second well-region (20); the device further comprising: a first gate (61) disposed over a base region (32) so that a MOSFET channel can be formed between an emitter region (36a, 36b) and the first well region (22); the device further comprising: a second gate disposer over the second well region (20) so that a MOSFET channel can be formed between the first well region (22) and the drift region (24).

12 Claims, 8 Drawing Sheets

BIPOLAR MOSFET DEVICE

CLAIM OF PRIORITY

This application is a national phase application under 35 U.S.C. § 371 of International Application No. PCT/GB00/03443, filed Sep. 7, 2000, which was published Mar. 15, 2001, as International Publication No. WO 01/18876.

This invention is generally concerned with the family of power semiconductor devices of the kind which combine bipolar and MOS technology.

There is a wide range of such devices. At one extreme, outside the family, are power MOSFET devices. They included the DMOS power MOSFET fabricated with the vertical DMOS process (DMOS is a double-diffused MOS process). In that process, a device is made on a body of monocrystalline silicon using numerous source/gate cells formed at one surface of the body and coating with a common drain region formed at the opposite surface. The source/gate cells are connected in parallel and provide numerous parallel filaments for current to flow through the main internal region of the device known as the drift region.

The combination of bipolar and MOSFET technology has a bipolar transistor structure to provide the main load current-carrying path through the device and a MOS structure which controls the bipolar transistor. The MOS structure provides a high impedance input consuming little input power. It may thus be made compatible with external control circuitry based on MOS technology.

The bipolar transistor may vary in different devices from an essentially three-layer structure, e.g. an NPN transistor, in which the emitter is closely associated with the source of the MOS part of the device, to structures of four or five layers, for example having a thyristor (e.g., a MOS controlled thyristor, in which the cathode is closely associated with the source of the MOS structure. It is known to implement these different bipolar transistor/MOS devices in a vertical structure in a body of monocrystalline silicon in which the emitter/source or cathode/source/gate is provided as numerous cells at one surface of the body while the collector or anode is provided in common region formed at the opposite surface of the body. For ease of nomenclature, the emitter/source and cathode/source structures may both be generally referred to as "cathode/source" or cathode structure, and the collector and anode may be generally referred to as "anode". However, it should be noted that the inventive concepts described herein can be applied to devices in which N type materials are replaced with P type materials and vice versa.

In operation, the cathode/source/gate cells in a device are connected in parallel, which may be done by internal device metallisation. It is a common feature of the family of devices that the current path to the anode from the cathode structure lies through a drift region. In designing such devices, there is a balance to be achieved between a low resistance forward conduction path and a high forward breakdown voltage capability.

One device of the power bipolar/MOSFET semiconductor family which has gained wide application is the insulated gate bipolar transistor (IGBT) which is an PNP transistor controlled by an N channel enhancement-type MOSFET. The IGBT is a three-terminal device. A second device is the emitter-switched thyristor (EST) which has two integrated MOSFETs with their gates connected to a common gate terminal. It is likewise a three-terminal device. A third device is a four-terminal device of the thyristor type having a separate gate turn-off facility in addition to the usual control gate for turning the device on.

The cathode cell structure of MOSFETs and of bipolar/MOS devices may be fabricated in a planar gate structure at the semiconductor surface or utilising trench gates first developed in connection with power MOSFETs. The cathode structures may also be implemented in planar or trench form.

The cathode structure for IGBTs is discussed in "Analysis of Device Structures for Next Generation IGBT", Y. Onishi et al, Proceedings of 1998 International Symposium on Power Semiconductor Devices and ICs, p. 85. The paper discusses the structure as applied in both planar gate and trench gate and the relative merits and deficiencies of the two. In the devices the channels of a respective pair of adjacent cells are formed in a common P well.

An insulated-gate controlled thyristor is disclosed in "A Filamentation—Free Insulated-Gate Controlled Thyristor and Comparisons to the IGBT", K. Lilja and W. Fichtner, Proc. ISPSD, p. 275, 1996. This proposes a device (IGCT) to improve reliability in terms of filamentation failures while preserving thyristor-like on-state properties.

Another form of four-terminal MOS-gated thyristor switch having a gate turn-off facility, referred to as a "FiBS", is disclosed in "The FiBS, A New High Voltage BiMOS Switch", K. Lilja, Proc. ISPSD, 1992, p.261, and in U.S. Pat. No. 5,286,981, Lilja et al. A large FiBS would consist of a number of integrated parallel cells. This device can be implemented in planar or trench gate technology.

A MOS-gated Emitter Switched Thyristor is described in "Trench Gate Emitter Switched Thyristors" by M. S. Shekar, J. Korec and B. J. Baliga, Proc. 6th International Symposium of Power Semiconductor Devices and ICs, 1994, paper 5.1, 189. This device is a three-terminal device which is implemented in a trench gate cell structure.

In the prior proposals neighbouring cells can have corresponding structural elements formed within a common doped region or well.

The present invention provides a new form of cathode structure involving clusters of cathode/gate elements. This new form of cluster cathode structure may in turn be used as a cell in a cellular structure form of cathode.

The invention may be implemented in various forms described below. The devices to be described incorporate a MOS-thyristor structure and achieve an enhanced performance while maintaining the desirable characteristics of uniform current distribution, good current saturation performance, small device size (incorporating closely packed cells) and good safe operating area (SOA).

According to the invention there is provided a semiconductor device comprising:
  at least one cell comprising a base region of a first conductivity type having disposed therein at least one emitter region of a second conductivity type;
  a first well region of a second conductivity type;
  a second well region of a first conductivity type;
  a drift region of a second conductivity type;
  a collector region of a first conductivity type;
  a collector contact;
  in which each cell is disposed within the first well region and the first well region is disposed within the second well region; the device further comprising:
    a first gate disposed over a base region so that a MOSFET channel can be formed between an emitter region and the first well region;
    a second gate disposed over the second well region so that a MOSFET channel can be formed between the first well region and the drift region;

and in which the device is configured such that during operation of the device a depletion region at a junction between the base region and the first well region can extend to a junction between the first well region and the second well region, thereby substantially isolating the potential of the first well region from any increase in the potential of the collector contact so that the device can be turned off without having to form a MOSFET channel between the base region and the second well region.

The ability to protect the first well region from excess potentials due to the extension of the depletion region at the junction between the base region and the first well region to the junction between the first well region and the second well region is hereinafter termed "self-clamping". The self-clamping leads to numerous advantageous features, both in the on-state and off-state of the device, which are discussed in more detail below. Key characteristics of devices of the present invention include: low forward drop; good SOA; high breakdown voltage; switching capabilities which are comparable to those of an IGBT; N-channel MOS gate control; the provision of three terminal devices; full compatibility to a CMOS process, enabling monolithic integration of low voltage and high voltage devices; easy scaling of gate oxide thickness to 400 Å or lower to achieve low drive power requirements ; and reduced gate capacitance as a result of reduced gate dimensions over the drift region.

It should be noted that FiBS device are four terminal device which require an independent P MOSFET to control turn-off of the device. Turn-off of devices of the present invention does not require such a MOSFET structure.

The first conductivity type is typically P, and the second type N. However, it is possible to produce devices in which the first conductivity type is N, and the second P. Devices according to the invention can be vertical or lateral.

A plurality be disposed within the first well region, each base region having at least one emitter disposed therein. In this way, clusters of closely packed "cells" can be produced, which leads to high, homogeneous current density.

The cell or cells may be substantially symmetric about a vertical axis extending through the first well region. In contrast, FiBS devices are inherently asymmetric because of the need to integrate a PMOS channel to control turn-off. Symmetric devices are desirable, because i) more of the (in the case of the first conductivity type being P) cathode area is available for conduction and ii) current homogeneity is improved.

The device may be an insulated gate bipolar transistor (IGBT) type device wherein on-state conduction proceeds mainly through a thyristor comprising the first well region, the second well region, the drift region and the collector region.

The IGBT type device can be planar, of the trench gate type, of the trench cathode type, or of the trench gate and trench cathode type. The device can be realised in a PT-IGBT (punch through) configuration, in which the drift region comprises epitaxial layers of a heavily doped buffer layer and a lightly doped region. Alternatively, a NPT (non punch through) configuration can be adopted, using a homogeneous lightly doped wafer as the drift region.

In another embodiment, the device is an emitter switched thyristor (EST) type device further comprising a heavily doped isolation region of the first conductivity type which is in contact with the second well region and in direct electrical contact with the base regions and emitter regions.

In another embodiment still, the device is an insulated base emitter thyristor type device further comprising a heavily doped isolation region of the first conductivity type in contact with the second well region, the isolation region having a floating ohmic contact formed thereon so as to provide direct electrical contact with the first well region.

The present invention and its practice will be described with reference to various embodiments of it illustrated in the accompanying drawings, in which:

FIG. 1 is a simplified cross-section showing the structure of an IGBT/thyristor device of the present invention using planar gate technology;

FIG. 1 a is an equivalent circuit of the device of FIG. 1;

Figure 1:
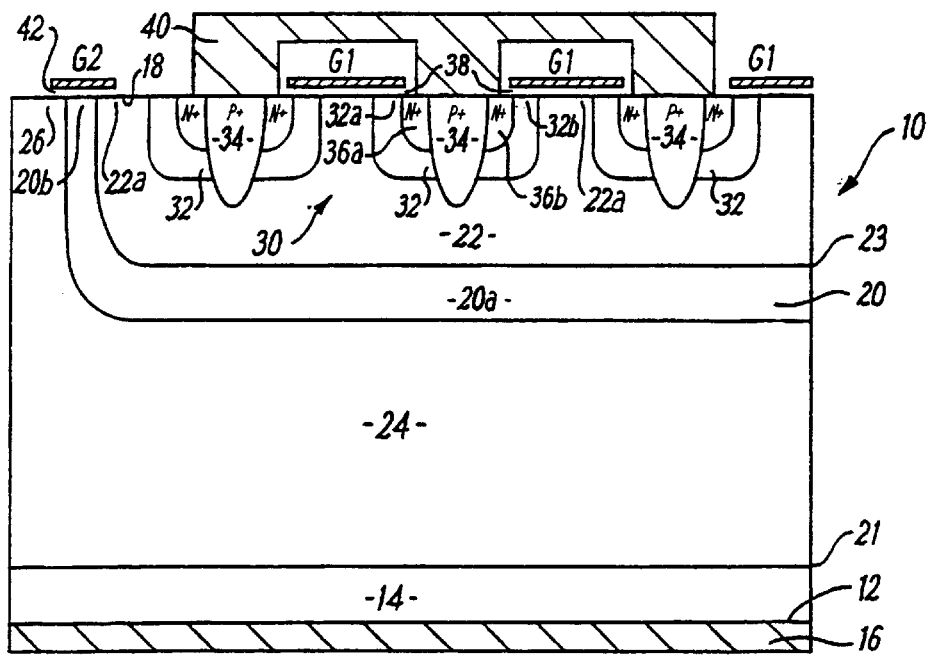

FIG. 1 shows in simplified cross-section the structure of a device, which can be regarded as a combination of an IGBT and a thyristor. The device has an equivalent circuit shown in FIG. 1a. The equivalent circuit is shown as having two interconnected sections the IGBT and the thyristor as will be described later. The gates in the device illustrated in FIG. 1 are in a planar gate form. The cathode cells of the IGBT are provided in a cluster as will emerge from the following description.

FIG. 1 shows a portion 10 of a body of semiconductor material, typically monocrystalline silicon, the lower surface 12 of which comprises a P+ collector region 14 to which a collector contact 16 (the anode in this example) is made. The device is a NPT device fabricated from N type silicon through which diffusions are made to provide a pattern of cathode cells at the upper surface. PT devices are also within the scope of the invention.

The device structure includes a P well 20 into which an N well 22 is diffused to lie within the P well both vertically and laterally, thereby leaving a P region 20a in the main current path and a region 20b emerging at the surface 18. The P well is separated from the anode by the region 24 of the N type silicon which provides the N drift region as commonly found in the IGBT and other devices of this family. It will also be seen that the N drift region extends upwardly at 26 to surface 18 laterally exterior to the P well 20. The region 20b provides a channel for a MOSFET as will be described subsequently.

Within the N well 22 a cluster of cathode cells 30 are provided.

The cells 30 are of identical structure so that only one of them will be described in detail. Referring to the centre cell of the three shown, it comprises a shallow P base 32 diffused into N well 22. Centrally of the well 22 a P+ region 34 is diffused to penetrate below the base 32 and project into region 22. To each side of region 34 a respective N+ emitter region 36a, 36b is diffused into P base 32, each region forming a non-rectifying junction with the P+ region 34. To each side of emitter region 36a and 36b a portion 32a, 32b respectively of P well 32 emerges to provide a channel for a cathode MOS transistor as will appear from the following description. All the diffusions are made through surface 18. It will also be seen that the cells 30 are spaced so that a portion 22a of N well 22 emerges at surface 18. A plurality of a first type of gate G1 are provided on the surface 18 overlying gate oxide 38. Each gate G1 is formed on gate oxide and extends over an emergent portion 32a of one cell and 32b of its neighbouring cell thereby providing two control MOSFETs. Each MOSFET has an N+ region 36a or 36b as a source and an emergent portion 22a of N well 22 as a drain. Thus each cell provides two control MOSFETs to which separate G1 gates are applied and each G1 gate controls two MOSFETS from separate cells. It is possible, instead, to connect the MOSFETs together to provide a single terminal.

It will be seen that the structure of cells 30 can be repeated as frequently as required within a given P well 20 N well 30 combination. This structure can be repeated not only in the plane of the drawing as illustrated but can be repeated normal to that plane so that the cluster is a three-dimensional array of cells. To complete the cell cluster metallization 40 is applied to each cell to bridge all the P+ N+ junctions and to connect all the cells in parallel. The metallization 40 provides the cathode contact for the device.

To complete the device structure, it will be seen that the cells at the outer extremities of the cluster 30 at the left in FIG. 1 are not fully utilised. A second type of gate G2 is applied over gate oxide 42 overlying the region 20b of P well 20. Region 20b provides a channel between a source provided by the emergent portion 22a of N well 22 and the neighbouring emergent portion 26a, of N drift region 24. It will be seen that the G1 gates control conduction between the cathode cells 30 and the P well 20, whereas the gates G2 control conduction between the cells 30 as a cluster unit and the anode region 16. The operational function of the device will be further described with reference to FIG. 1a. It will be noted, however, that the semiconductor unit described thus far incorporating the cluster cathode cell unit structure can itself be repeated to provide a group of such units all coating with a common anode region. An important feature of the cell structure described and illustrated is its symmetric design. This is referred to further below.

Figure 1A:
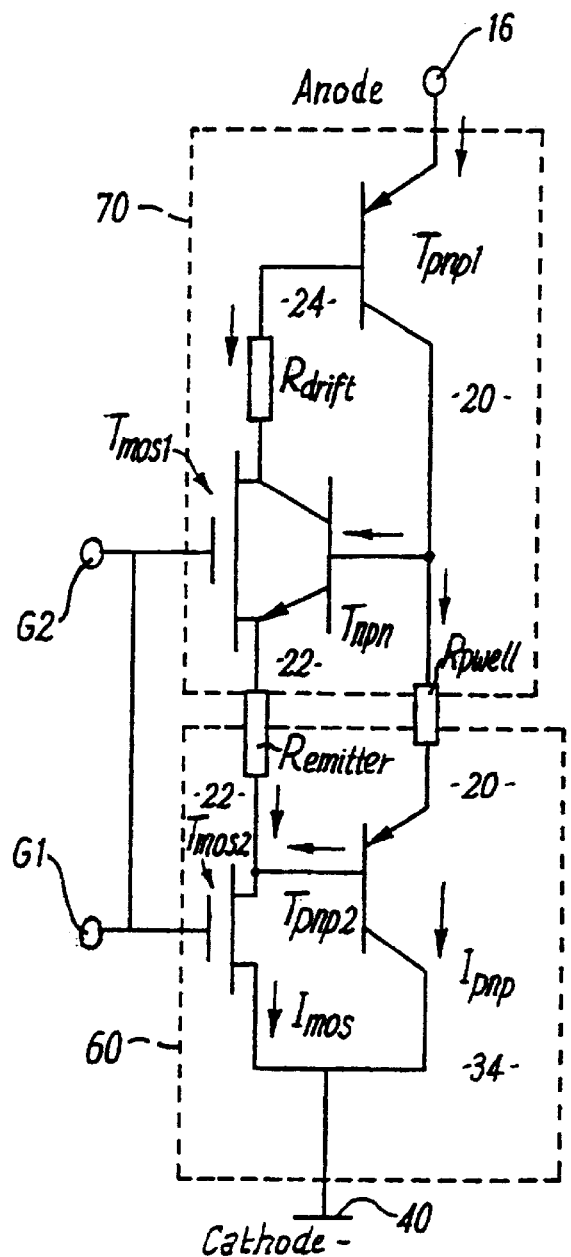

Referring now to FIG. 1a, it will be seen that the parallel cathode cells are represented as a single bipolar transistor and a single MOSFET. The gates G1 and G2 are all connected together although separate operation of the gate is also possible. Also, it is possible to extend the gate G2 to overlap with an N+ emitter region. In operation the anode has a positive voltage applied to it with respect to the cathode and the device is turned on by raising the gate voltage positive with respect to the cathode. For ease of identification of the formation of circuit elements in FIG. 2, relevant regions of FIG. 1 are indicated on FIG. 2.

Looking at the device structure of FIG. 1 in terms of circuit elements in FIG. 1a, each cathode cell provides the collector (P+ region 34) of a plural collector PNP vertical transistor whose base is the N well 22 and whose emitter is the P well 20. Conductivity modulation of the base is provided by the enhancement type N-channel MOSFETs between regions 32a and 34a and regions 32b and 34a. In FIG. 1a the plural collector transistor is indicated as Tpnp2 and plural MOSFETs are shown as MOSFET Tpnp2. Turning on $T_{mos2}$ triggers $T_{pnp2}$ into conduction. This part of the equivalent circuit denoted by 60 acts an IGBT.

A second PNP transistor is formed between the P well 20 (collector), N drift region 24 (base) and anode region 12 (emitter). This transistor is denoted $T_{pnp1}$ in FIG. 2. $T_{pnp1}$ and $T_{pnp2}$ are thus in series, with region 20 being common to both and having a resistance Rpwell in the series connection between the two transistors.

Associated with $T_{pnp1}$ is another transistor of NPN type provided by N drift region 24 collector; P well 20 as its base and N well 22 as its emitter. $T_{pnp1}$ is connected in a latching thyristor configuration 70 with $T_{npn}$. The resistance $R_{drift}$ of the drift region 24 appears in the base path of $T_{pnp1}$. The N well provides resistance $R_{emitter}$ between the emitter of Tnpn and the base of $T_{pnp2}$.

The thyristor section 70 also includes a control MOSFET $T_{mos}$ whose source-drain path shunts the base-emitter path of transistor $T_{npn}$. The MOS control transistor is formed between regions 24a and 22b and controlled by gate G2. Turning on $T_{mos1}$ in series with $T_{mos2}$ allows emitter current to flow in $T_{pnp1}$ which then diverts sufficient collector current into $T_{npn}$ to turn the latter on with a regenerative latching action between the two. At the same time IGBT 60 is turned on and the main current path $I_{pnp}$ is completed through $T_{pnp2}$. It will be noted that the gate voltage at G2/G1 required to initiate conduction of both MOSFETs is greater than that for $T_{pnp2}$ alone. Once the thyristor section 70 is latched, G2 loses control but if the voltage on G1/G2 is reduced to cathode potential this will turn off the IGBT, breaking the main current path and un-latching the thyristor.

Figure 12A:
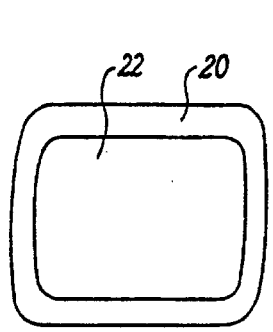
FIG. 12a is a top plan view of the device of FIG. 1 showing a polygonal N well in a generally polygonal P well.

FIG. 12 shows how a device of the type shown cross sectionally in FIG. 1 might be realised in three dimensions. FIG. 12a shows how a generally polygonal N well 22 can reside in a generally polygonal P well 20. For reasons of presentational simplicity, other device features are omitted from FIG. 12a. The surface portion of both of the P well and N well might alternatively be circular.

Within the N well 22, individual dells (not shown) can be circular, polygonal, in the form of stripes, or combinations of these forms.

Figure 12B:
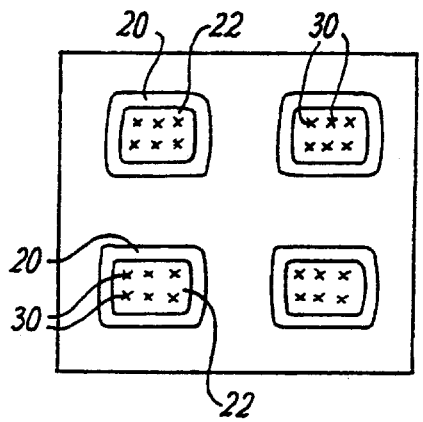
FIG. 12b is a top plan view of the device of FIG. 1 showing a plurality of P well and N well structures.

FIG. 12b shows a device comprising a plurality of P well 20/N well 22 structures, each structure containing a cluster of cells 30.

Having explained the basic operation of the device of FIG. 1 some features of its operating parameters will be discussed in more detail.

On-state Performance:

When a positive bias above the threshold voltage is applied to the gates G1 and G2, the cathode MOSFETs are turned on and the electrons are supplied into the N-drift region 24 through $T_{mos1}$. When the anode voltage is above the bipolar on-set voltage, holes are injected from the anode. However, there is no path for holes to flow directly into the cathode regions, as in the case of IGBTs or ESTs. As a result, the potential of the P well region 20 increases.

The concentration of the N region 22, which acts as the emitter of $T_{npn}$, plays an important role in the turn-on of the device and is above the critical limit required to create a barrier for holes, as in the case with the charge stored IGBT (CS-IGBT). When the control gates G1/G2 are ON, the N well 22 is tied to the cathode potential through the accumulation region formed in the N well region and the inverted channels 32a, 32b in the P base region 32. With increase in the potential of the P well 20, the transistor $T_{npn1}$ is turned-on. This results in the firing of the thyristor.

Current Saturation Feature:

Normally, turn-on of thyristor 70 occurs prior to the saturation of the control MOSFETs. Once the MOSFETs are saturated, the N well/P well (22+20) potential increases. This increase in the potential leads to the enhancement of the P base 32/N well 22 depletion region. As the concentration of the N well 22 is lower than that of the P base 32, the depletion predominantly moves into the N well region. At a certain design voltage (determined by the doping concentration, the depth of the N well, the depth of the P base and the MOS channel saturation characteristic), the depletion touches the P well/N well junction 23 and at that point, the device becomes clamped. The self-clamping feature ensures that any further increase in the anode potential is dropped only across the P well/N drift region (20+24).

Forward Blocking:

The forward blocking voltage capability of the device is significantly higher than that of a planar IGBT for a given technology because, the P well/N drift region junction 21 is plane-parallel except at the edges of the device. Furthermore, in a conventional IGBT, because of the deep P+ region, the depletion region moves essentially into the N drift region. In the clustered IGBT, however, the potential sharing by the P well 20 results in a lower peak electric field for a given blocking voltage. Therefore, for a given blocking ability, the wafer is much thinner for the clustered thyristor device of FIG. 1 than that of a conventional IGBT. This has a direct and favourable implication on the forward drop, switching performance, thermal properties and the stability.

For a given breakdown voltage (BV), the device can be designed in two ways:

(a) when the P well 20 concentration is high, the entire blocking voltage is dropped across the P well/N drift region 20+24).

(b) When the P well 20 concentration is low, with increase in the anode bias, the P well layer gets depleted. Then, any further increase in the voltage is dropped across the N well (22)/P base (32/34) junction. As the device is designed with a "self-clamping" feature, the N well/P base depletion region extends into the P well, thereby preventing any further increase in the N well (22) potential.

Turn-Off;

The device turn-off performance is similar to that of the IGBT. When the control gate G2 is turned-off, the potential across the P base/N well (32+34/22) increases until self-clamping occurs. Once it is clamped, the wide nature of the P well (20) enables the holes to be collected to the P base region (32+34) effectively. The symmetric nature and close-packing of cells ensure that the device current flow is homogeneous in all cases, unlike the MCTs. Unlike the ESTs, the self-clamping ensures that the voltage across the control MOSFET does not increase beyond the self-clamping voltage.

How does the clustered IGBT/thyristor differ from other structures?

The clustered IGBT/thyristor device is entirely different from conventional IGBTs. In the case of IGBTs, a deep P+ region is required to suppress parasitic latch-up and to achieve the required blocking voltage ability. However, the requirement of a deep P+ region makes the cathode cells much bigger in comparison to those of the clustered IGBT/thyristor. For example, based on a 3 μm design rule, the minimum cathode cell dimension of a DMOS IGBT is about 36 μm while it is 15 μm for a clustered IGBT/thyristor cathode cell based on the CMOS process. It is also possible to reduce the cathode cells of the IGBTs by choosing sub-micron fine-line [FL] lithography techniques. In the case of FL-IGBT and FL-EST, the thin oxide extends over the JFET region. Superior forward blocking safe operating area FBSOA characteristics of these devices have been demonstrated under static conditions. However, under inductive load switching conditions, where the high current and high voltage exist simultaneously, the properties of the device are yet to be fully demonstrated although short circuit performance is poor. It is considered that, under these circumstances the FL-IGBT or FL-ESTs will fail.

Furthermore, simulations have indicated that a distance between adjacent cells of 6 μm is adequate for a good performance in a clustered-IGBT/thyristor. In the case of an IGBT, the optimum dimension depends upon the cell geometry and the blocking ability and is usually above 25 μm for devices with more than 2 kV rating.

The performance of the clustered IGBT/thyristor is superior to that of the DMOS-IGBT.

Furthermore, this device structure embodying the invention is significantly different from ESTs such as that disclosed in U.S. Pat. No. 5,293,054 in two ways. Firstly, a charge controlled N emitter region within which conductivity modulation takes place in the on-state, separates the P base and the P well regions. In this manner, this device is also different from the trench EST reported by Shekar et al abovementioned which uses a heavily doped N+ floating emitter region. In all the ESTs mentioned above, the current saturation is achieved only as a result of control MOSFET saturation. However, the control MOSFET is usually a low voltage MOSFET and as a result, when the potential of the N+ floating emitter increases beyond the breakdown voltage of the control MOSFET, the device will fail. In the clustered IGBT/thyristor, a self-clamping feature exists in addition to the series MOS channel saturation. As a result, the potential at the cathode regions does not exceed the design self-clamp voltage even under switching conditions. This clamping voltage is much smaller than the MOSFET breakdown voltage.

How does clustered IGBT differ from FiBS?

(a) Unlike the clustered IGBT/thyristor device described above, the device cells in the FIBS are asymmetric.

(b) For a given area and the number of cathode cells, there are twice the number of N+ cathodes and control channels in the clustered IGBT/thyristor in comparison to the FiBS. As a result, the device is expected to show significant improvement in forward drop performance in comparison to FiBS.

(c) FiBS is a three gated structure. A NMOS Gate is used to control the turn-on in a manner similar to an EST; A PMOS gate is used to control the turn-off. The third gate is to turn-on the device, like a clustered IGBT. The voltage across the PMOS gate determines the breakdown during switching.

(d) The processing of the FiBS, as reported in U.S. Pat. No. 5,286,981 is very different from that of the clustered IGBT. (e) The "DMOS FiBS" uses a heavily doped N++ emitter. This is absent in the clustered IGBT/thyristor.

(f) The saturation mechanism is very different from that of the clustered IGBT/thyristor. That is, in the case of FiBS, the saturation is achieved by turning-on the PMOS device. In the case of the clustered IGBT/thyristor described, the current saturation is achieved by self-clamping. That is, as the P base/N well junction is reverse-biased, the depletion region increases below the P base region and touches the P well. When it is reached, the potential across the cell is clamped and the P well/N drift junction supports any further increase in the voltage.

(g) The fabrication of the IGCT/FiBS requires an epitaxial layer. The clustered IGBT can be formed using triple diffusion of P well, N well and P base.

(h) The clustered IGBT/thyristor can be fabricated using a CMOS process with a few diffusions added prior to the start of the CMOS sequence. The process of fabricating FiBS is not. As a result, it will be possible to integrate gate control circuitry, based on CMOS or analog, in the gate pad area of the device. Current sensing and gate protection circuits can also be integrated at cluster level and the device level. Furthermore, with a decrease in carrier life-time the N well concentration can be increased to reduce the forward drop.

The clustered cathode cell arrangement described above can also be applied in other devices in the Bipolar/MOS family. Examples of such devices will now be given.

Clustered EST

By adding deep P+isolation to the basic clustered IGBT/thyristor structure of FIG. 1, the device operation can be made very different. In this case, the device operates like a clustered EST. An example is shown in the cross-section of FIG. 2 which is the same as that of FIG. 1 with one added feature. The following description will, therefore, be confined to the added feature and its operational effect.

Figure 2:
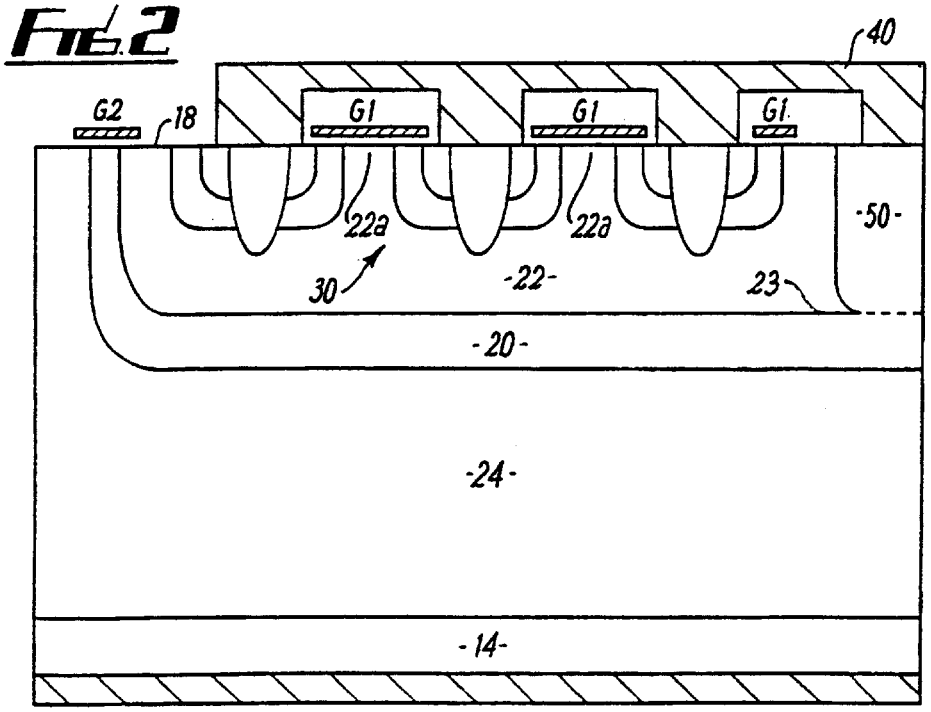
FIG. 2 shows one modification of the FIG. 1 structure to provide an EST device.

As can be seen from FIG. 2, a separate P+ isolation region 50 is added to the clustered IGBT/thyristor of FIG. 1. It is diffused from surface 18 and extends through N well 22 into the P well 20. The region 50 is connected to the common cathode cell metallisation 40. As a result, the P well 20 is no longer floating but at cathode potential. In comparison to the device of FIG. 1 and FIG. 1a, the forward characteristics of the FIG. 2 device are very different. This is because, when the anode/N drift region (14/24) is forward-biased and with the gates G1, G2 turned ON, holes are injected into the device. These holes now flow towards the P+ isolation region 50. Depending upon the resistance of the P well 20, the flow of the hole current will cause the junction 23 between the P well 20 and N well 22 to be turned-on. When this happens the NPN transistor involving the N well 22/P well 20/N-drift region 24 is turned on, resulting in the formation of a MOS controlled Emitter Switched Thyristor.

As a result of this modification, it is now possible to increase the concentration of the N well 22 between the cells at regions 22a. Furthermore, in comparison to other EST structures, due to the previously described self-clamping feature, the clustered EST does not suffer from control MOSFET breakdown.

Clustered Insulated Base EST (IBEST)

The forward characteristics of the clustered EST depends upon the resistance of the P well 20. If the resistance of the P well is low, the thyristor turn-on voltage is high. In order to overcome this limitation, it is possible to fabricate a device with the configuration shown in FIG. 3. This device is of the same structure as that of FIG. 1 but with an added feature. The following description will be confined to the added feature and its operational effect.

Figure 3:
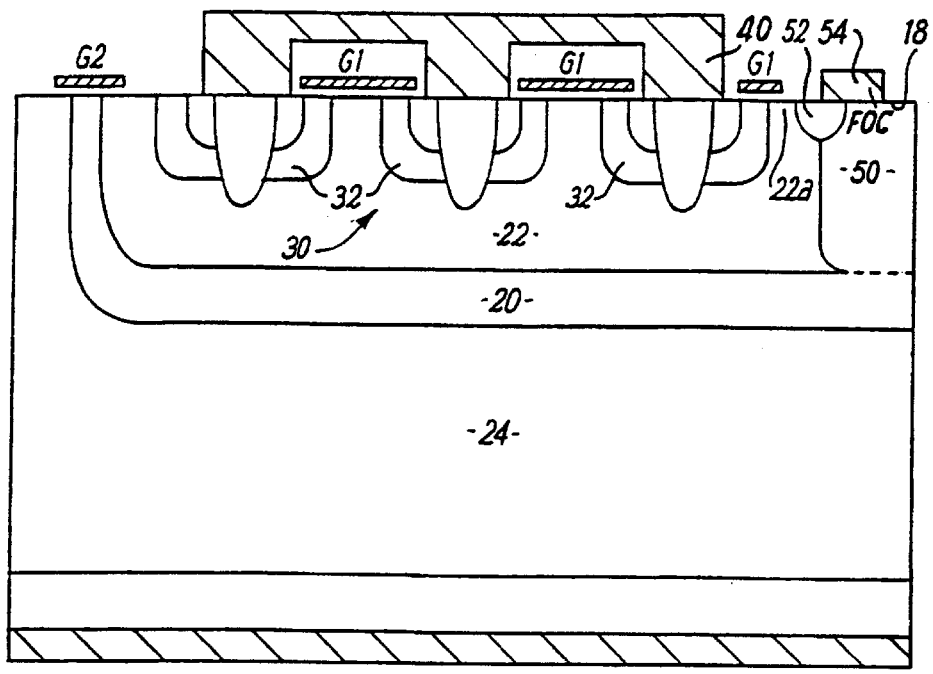
FIG. 3 shows another modification of the FIG. 1 structure to provide an insulated base EST device.

In the device of FIG. 3, a P+ isolation region 50 is provided similarly to FIG. 2. It isolates the cluster of cathode cells 30 within the P well 20. However, the isolation region 50 is treated differently to that of FIG. 2. In association with the diffusion of region 50 to reach the P well 20, an N+ region 52 is diffused adjacent surface 18 to intersect both the adjacent surface portion 22a of N well 22 and region 50 itself. The P+/N+ junction thus formed is non-rectifying and is overlaid by metallisation 54—separated from metallisation 40—so as to form a floating ohmic contact (FOC). The FOC connects the P+ region 50 to the N well 22 through the N+ region 52c. This floating ohmic contact is not connected to any device electrode terminal and therefore, the device is still a three terminal device.

The operation of the device of FIG. 3 is as follows. When the gates G1, G2 are turned-on, electrons flow into the N drift region 24. The FOC acts like an electron-to-hole converter. As the P well 20 is now floating, the potential of the P well increases and as the N well 22 is tied to the P well potential, the voltage drop across the control MOSFETs increases. As a result, the electron current flow increases. With increase in the N well/P well potential, the drop across the P base/N well (32/22) increases until self-clamp occurs.

Figure 4:
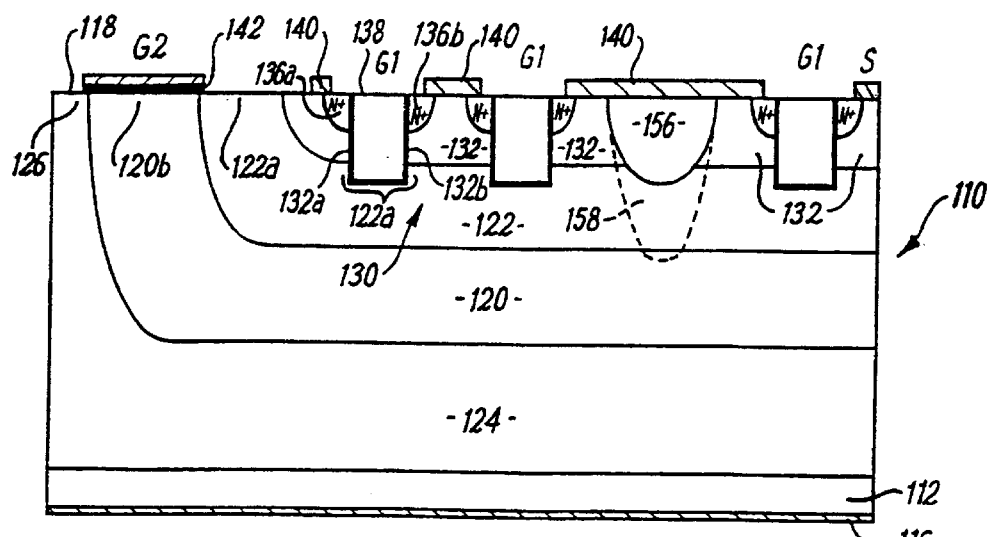
FIG. 4 shows an IGBT/thyristor device implemented in trench gate technology, with a further modification.

The implementation of an IGBT/thyristor using a cathode cell cluster in trench gate MOS is shown in FIG. 4. A NPT structure is shown. The figure also illustrates the provision of an isolation region.

In FIG. 4 layers and regions having the same or similar functions to those of FIG. 1 are denoted by the same reference numeral increased by "100".

The device 110 of FIG. 4 comprises a semiconductor body using a P+ substrate 112 which substrate 112 provides a common anode region to which anode contact 116 is made. N drift region 124 lies above the anode region and extends to opposite surface 118 at 126. The device further comprises P well 120 into which N well 122 is located, spaced vertically from region 124 and laterally from its extension to the surface at 126. The surface adjacent portion 120b of P well 120 provides a channel between the neighbouring portions 126 and 122a. The channel is overlaid by Gate 2. In FIG. 4 gate oxide is shown as black.

Ignoring for the moment the presence of the region labelled Pwell2, it will be seen that the N well contains a cluster of cathode cells 130, of which three are shown. Each cell is of the same symmetric construction. The cells are formed in a single P base region 132 which is intersected by the gate structure of each cell. Taking the cell at left, the gate structure comprises a trench extending from the surface 126 into N well region 122.

A polysilicon gate, Gate 1, is located in the trench and isolated from the adjacent silicon material by gate oxide 138. Adjacent the surface, N+ regions 136a and 136b are formed within the P-base material 132. The regions 132a and 132b provide respective channels of MOSFETs, each having a source 136a or 136b and a drain at the portions 122a of the N well 122 by the gate. As in FIG. 1, Gate 1 controls the conduction from the cathode/source contact metallisation 140 to the N well. In FIG. 4, the cathode contacts are provided by metallisation extending to each source region 136a, 136b and it will be noted that at the surface 118 the contacts bridge the PN junctions between the N+ regions 136a, 136b and the P base 134.

In an operational device the contact metallisation is interconnected to form a common cathode terminal and all the Gate 1 polysilicon is interconnected by metallisation (not shown). Thus the cathode cells all act in parallel with respect to the anode. Operation of the structure so far described is essentially as described for FIGS. 1 and 1a.

Turning now to include the provision of Pwell2, this is a P+ doped region 156 extending through P base region 134 into N well 122. It is contacted by the cathode metallisation 140, and results in a separate area in which self-clamping is achieved. The gates positioned on either side of the P well need not be interconnected, and may instead be separately electrically connected.

Another modification is that indicated in dotted lines in which Pwell2 is formed as a deeper region 158 penetrating into and connecting with Pwell region 120. Here region 158 acts as an isolation region as region 50 in FIG. 2 and the device becomes an EST.

Figure 5:
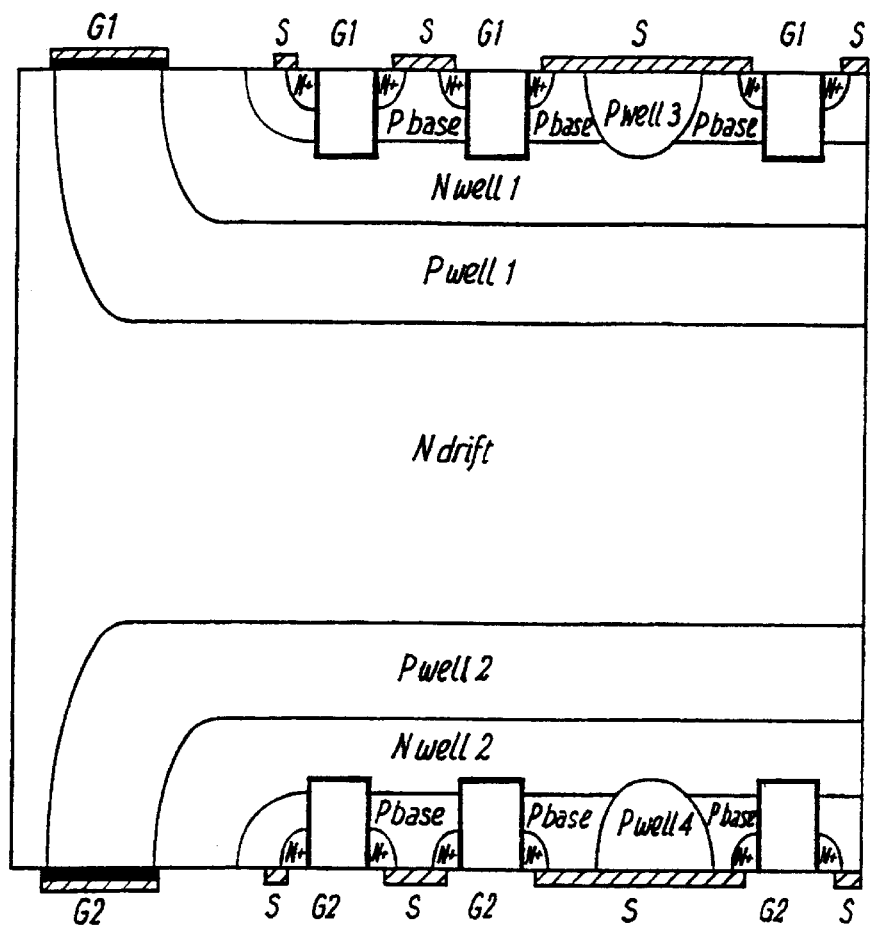
FIG. 5 shows a double gated trench IGBT/thyristor device.

FIG. 5 shows a an anode gated device, in which gate 2 is off when gate 1 is on and vice versa.

The invention can also be applied in other Bipolar/MOS structures. These structures include what may be called "quasi-vertical" devices and lateral devices. Examples of such devices will now be given with reference to FIGS. 6–11. Those features of device structure which are essentially the same as those of devices previously, described, will not be repeated here.

All the devices to be now described can be fabricated in any technology, such as: junction isolation (JI), dielectric isolation (DI), double-epitaxy layer dielectric isolation (DELDI). All the devices preferably employ a RESURF (reduced surface field) technique to achieve lateral breakdown voltage. Like the device already described a cluster cathode cell structure is utilized. The main functional principle of the cluster is providing a layer, such as the main N well, which acts as a barrier to holes. This applies in all the devices to be described.

Figure 6:
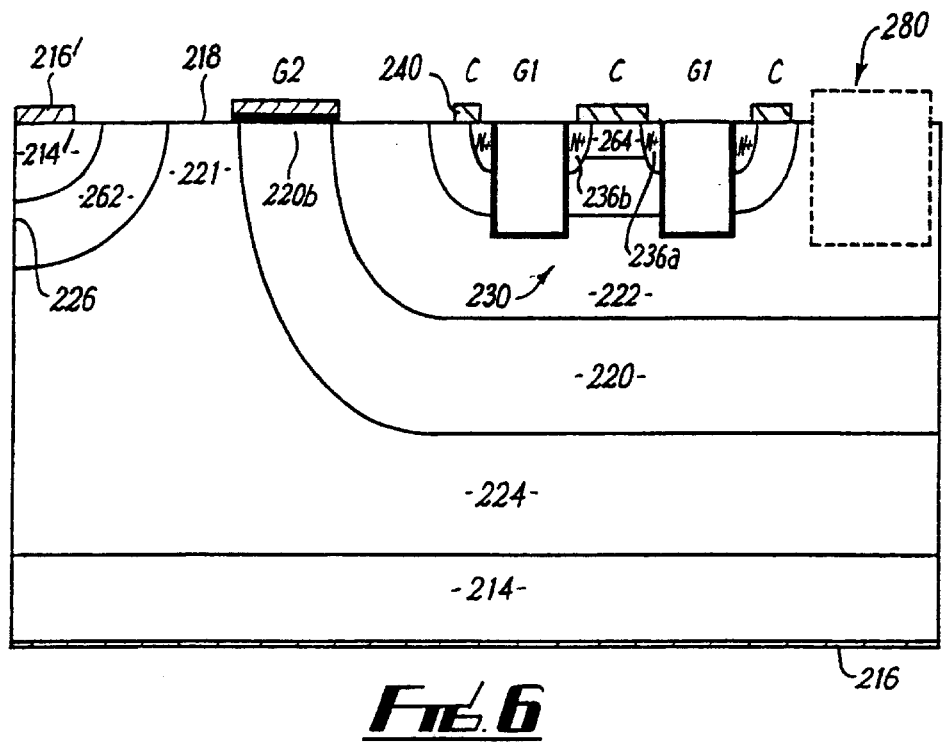
FIG. 6 shows lateral and/or quasi-vertical versions of the device of FIG. 4, and FIGS. 6a–6c show optional modifications of the structure of FIG. 6.

FIG. 6 shows a device having a cluster of cathode cells 230 in an N well 222. The structure is trench gate and the major features follow those of FIG. 4 without the Pwell2 region. In FIG. 6 a lateral anode structure is provided at upper surface 218 in the extension 221 of N drift region 224 to the surface 218. This anode structure comprises an N buffer region 262 diffused into region 226 in order to prevent punch-through. Into buffer region 262 a lateral anode P+ region 214' is diffused and has anode contact 216' made thereto. The device retains the anode structure 214, 216 at the lower surface. Anodes 216 and 216' can be connected together or separately. It is also possible to omit the anode at the lower surface so that only the lateral anode is provided. In this case the P+ substrate may also be omitted.

Gate 1 illustrated as trench may be planar instead. Gate 2 illustrated as planar may be trench instead. The cathode (C) can be planar metallisation in 240 or trench.

An optional addition to the cathode structure is the provision of a P+ region 264 between pairs of adjacent N+ source regions 236a, 236b, the associated cathode contact C extending over the boundaries between the P+ and N+ regions where they emerge at the surface.

FIG. 6 also serves to illustrate three other optional features which may be provided at the lateral zone 280 within the N well 222. These are illustrated in FIGS. 6–6c.

Figure 6A:
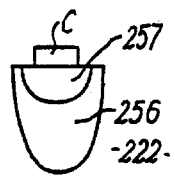

FIG. 6a shows the addition of a P well 256 into N well 222 but shallow enough that it does not contact the P well 220 in the main structure. A cathode contact C is made to this additional well preferably through a P+ diffusion 257. This provides a separate area for achieving self clamping. The optional features of FIGS. 6b and 6c result in the provision of ETS and IBEST devices, respectively.

Figure 6B:
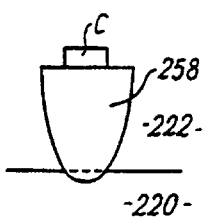
Figure 6C:
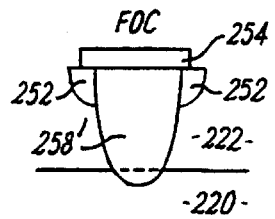

FIG. 6b shows a deep P+ well 258 that extends downwardly to contact the main P well 220 to provide an isolation region such as shown at 158 in FIG. 4. FIG. 6c shows a similar deep P+ 258' well extending to penetrate and contact P-well 220 but further adapted to be a floating ohmic contact (FOC) as described in relation to the embodiment in FIG. 3. Shallow surface adjacent N+ regions 252 form non-rectifying junctions with region 258' and the regions and junctions are overlaid by metallisation 254.

Figure 7:
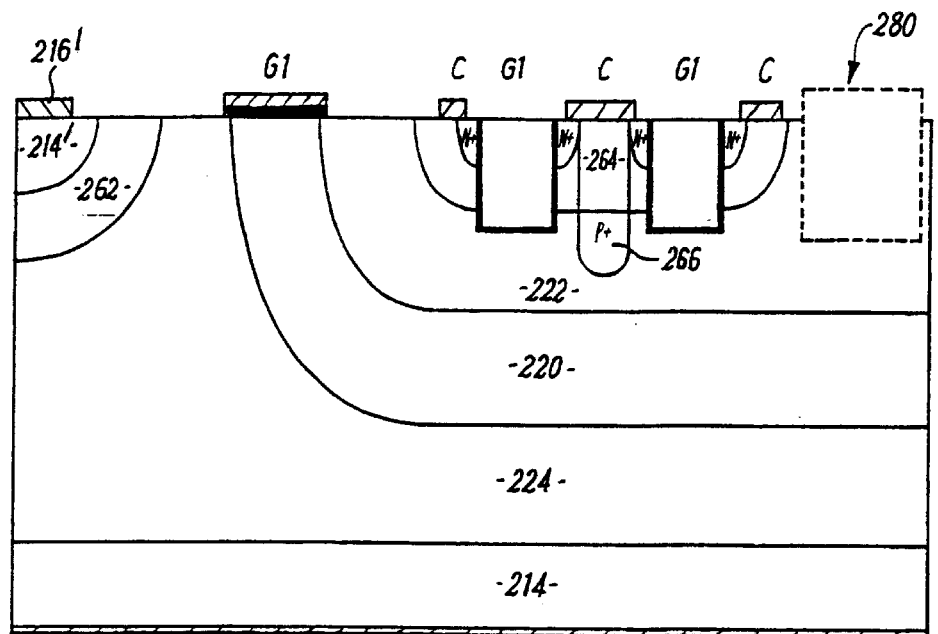
FIG. 7 shows a further modification of the device structure of FIG. 6.

FIG. 7 shows a further modification of the cathode cell structure of FIG. 6. Here the P+ region 264 is vertically downwardly extended at 266 to enter the N-well region 220, in order to provide a separate self clamping area. The structure is otherwise that of FIG. 6. Anode 1 and anode 2 can be connected together or separately, and both of the gate 1 and the cathode can be planar or trench.

Figure 8:
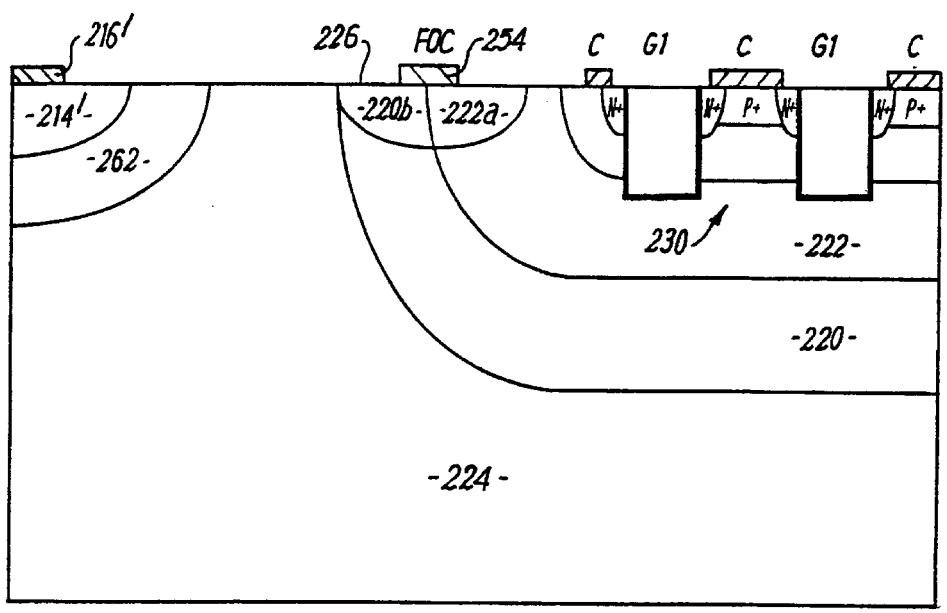
FIG. 8 shows a still further modification of the structures of FIGS. 6, 6a–6c, and FIG. 7 showing the replacement of Gate 2 by a floating ohmic contact.

FIG. 8 shows a further modification of the device of FIG. 6. In this modification Gate 2 controlling the channel region 220b of P well 220 in FIG. 6 is replaced by a floating ohmic contact to provide an electron path from N drift region 224 to the N well region 222. The portion 220B of P-well 220 emergent at surface 226 is made P+ and the contiguous portion 222a of N well 222 is made N+ with the metallisation contact 25A bridging the two. N+ region 222a is laterally spaced from the cluster cell structure. The other modifications that may be chosen as described with reference to FIG. 6 are also applicable to FIG. 8. The device of FIG. 8 can be on a P+ substrate, but need not be.

Figure 9:
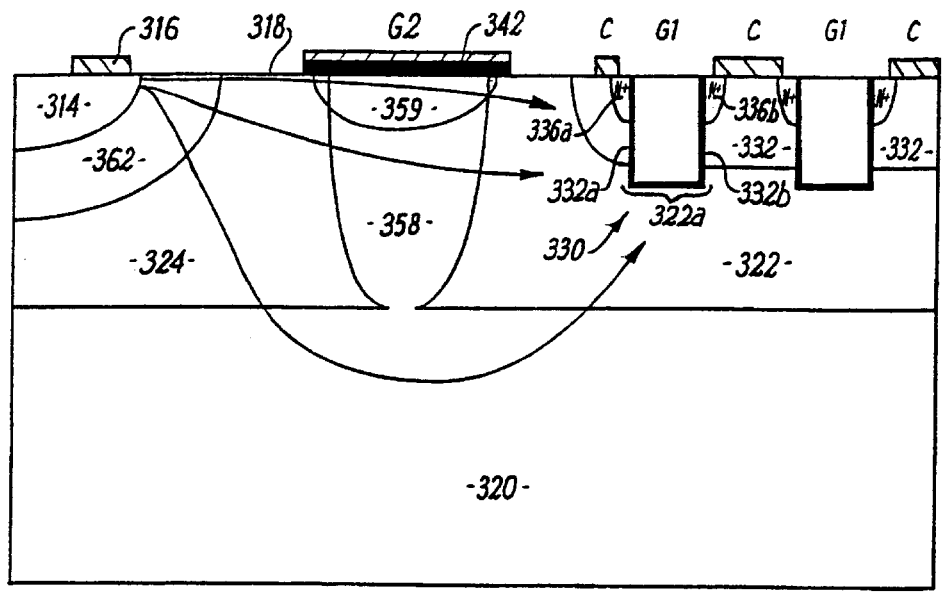
FIG. 9 shows a lateral version of the device of FIG. 6 with the inclusion of a P-isolation region.

FIG. 9 shows a lateral version of the device of FIG. 1. As will be seen the structure of FIG. 9 is defined essentially adjacent the upper surface 318 of the semiconductor body 310. The body has a lowermost P region 320. Above the P region 320 an N region is initially formed into which subsequent process operations are performed from the upper surface 318. In a lateral sequence, the device has a diffused P+ anode region 314 to which an anode contact 316 is made. The P+ region is itself diffused to lie within a more extensive N buffer region 320 diffused into the initial N region which is divided into two laterally spaced parts. The first is an N drift region 322 and the second is an N drift region 324. Whereas the drift region 324 has the anode structure formed in it, the region 322 has the cathode structure 330 formed in it. The two regions are isolated but are controllably connectable together by a MOSFET.

Between regions 322 and 324 a P+ isolation region 358 is diffused to extend to and penetrate the underlying P region 320. Region 358 separates the two drift regions. Electron flow between them is controlled by a MOSFET having a gate, Gate 2, formed on gate oxide 342. Gate 2 extends over both regions 322 and 324 as well as the region 358 at the surface 318. An N implant 359 is provided under Gate 2 to extend through the P+ region and into the adjoining portions of the N drift regions. The N implant reduces the majority carrier concentration in the channel under Gate 2, thereby reducing the threshold voltage required to turn on the MOSFET transistor.

The clustered cathode cell structure 330 formed in N drift region 322 will now be described. It is similar to that already described with reference to FIG. 4 in that it has a P base region 332 in which the cathode cells are formed to be controllably connectable to N drift region 322. Each cell of the cluster 330 comprises a trench gate, Gate 1, controlling conduction between a N+ source region 336a, 336b and N drift region 322. The trench gate extends through the base region 332, at which channels 334a, 334b, exist, and into the N drift region 322 which provides the drain 322a for each MOSFET channel. The source (cathode) contacts C are made to the regions 336a, 336b, (the metallisation for each contact bridging the junction between the N+ region and the P base region 332 where it emerges at the surface 314.

In practice, the cathode contacts C are interconnected as are the polysilicon trench gates, Gate 1, so that the cathode cells act in parallel with respect to the anode. Gate 2 can be connected to Gate 1 or be connected separately. Gate 1 can be implemented in planar form as well as trench. The cathodes C can be trench as an alternative to planar. The N drift region 324 can be of different thickness or differently doped to the N drift region 322. Region 324 is used to support the breakdown voltage, using RESURF. The device of FIG. 9 exhibits excellent on-state characteristics, and a high area efficiency.

Figure 10:
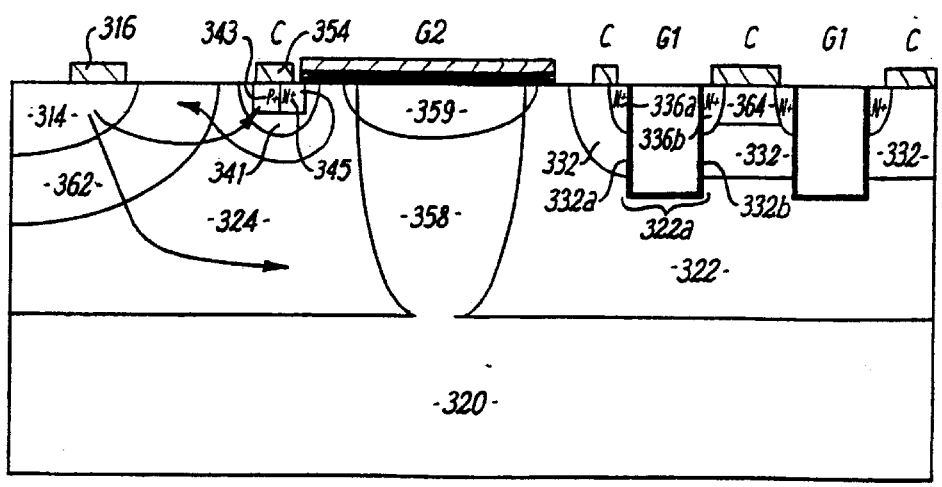
FIG. 10 shows a modification of the structure of FIG. 9 with a floating ohmic contact associated with Gate 2.

FIG. 10 shows a modification of the lateral device of FIG. 9. The anode drift region 324 has a floating ohmic contact formed at its surface cooperating with Gate 2. The P+, N+ regions 343, 345 of the FOC are formed in a shallow P well 341 and are shorted, as usual, by the floating contact metallisation 354. It will be noted that the N+ region 345 is located towards the N implant 359 and Gate 2 extends over the region 345. This promotes injection of electrons into the MOSFET channel, which results in reduced on-state resistance.

FIG. 10 also shows a further optional modification corresponding to that shown as 264 in FIG. 6. Adjacent N+ source regions of adjacent cathode cells are connected by a P+ region 364 and contacted by a common cathode contact. This results in more conducting channels and hence a higher current flow through the device.

Figure 11:
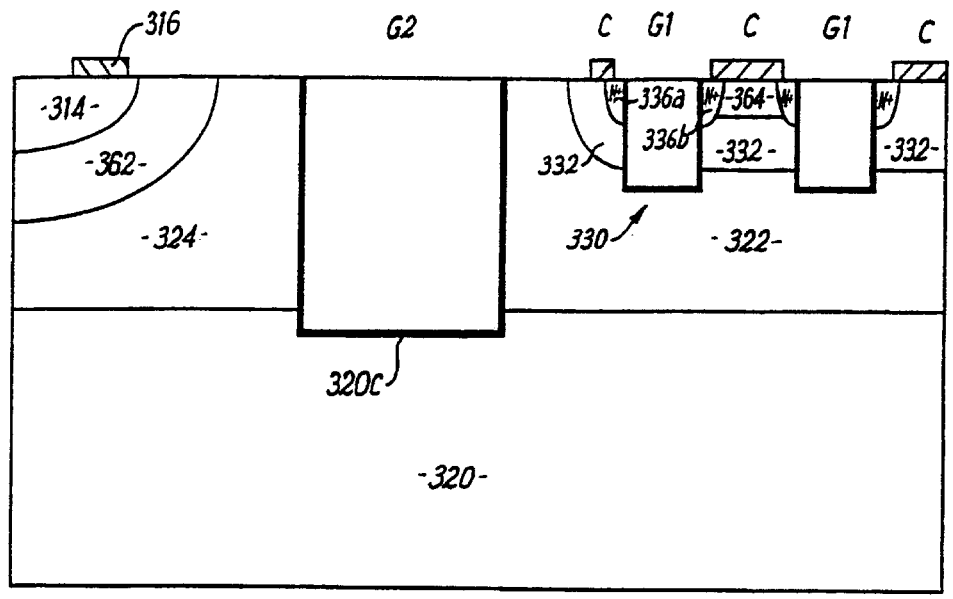
FIG. 11 shows a lateral version of the device of FIG. 6 with a trench gate for Gate 2.

FIG. 11 shows another modification of the device of FIG. 8. It shows the optional modification to the cathode structure mentioned in the preceding paragraph but more importantly shows Gate 2 implemented in trench form as previously described. The gate extends into the p region 320 and an enhancement mode channel forms in region 320c adjacent the gate with N drift regions 324 and 322 providing source and drain respectively.

What is claimed is:

1. A semiconductor device comprising:
   at least one cell comprising a base region of a first conductivity type having disposed therein at least one emitter region of a second conductivity type;
   a first well region of a second conductivity type;
   a second well region of a first conductivity type;
   a drift region of a second conductivity type;
   a collector region of a first conductivity type;
   a collector contact;
   wherein each cell is disposed within the first well region and the first well region is disposed within the second well region; the device further comprising:
      a first gate disposed over a base region so that a MOSFET channel can be formed between an emitter region and the first well region; the device further comprising:
         a second gate disposed over the second well region so that a MOSFET channel can be formed between the first well region and the drift region; and
         wherein the device is configured such that during operation of the device a depletion region at a junction between the base region and the first well region can extend to a junction between the first well region and the second well region, thereby substantially isolating the potential of the first well region from any increase in the potential of the collector contact so that the device can be turned off without having to form a MOSFET channel between the base region and the second well region.

2. A device according to claim 1 in which a plurality of base regions are disposed within the first well region, each base region having at least one emitter disposed therein.

3. A semiconductor device, according to claim 1, wherein:
   said at least one cell is substantially symmetric about a vertical axis extending through said first well region.

4. A semiconductor device, according to claim 1, further comprising:
   an insulated gate bipolar transistor type device, wherein an on-state conduction proceeds through a thyristor comprising at least said first well region, said second well region, said drift region, and said collector region.

5. A semiconductor device, according to claim 1, further comprising:
   an emitter switched thyristor type device;
   said emitter switched thyristor type device comprising a heavily dopes isolation region of said first conductivity type which is in contact with said second well region and in direct electrical contact with at least said base region and at least said emitter region.

6. A semiconductor device, according to claim 1, further comprising:
   an insulated base emitter switched thyristor type device;
   said insulated base emitter switched thyristor type device comprising a heavily doped isolation region of said first conductivity type in contact with said second well region; and
   said isolation region having a floating ohmic contact formed thereon so as to provide direct electrical contact with said first well region.

7. An insulated gate bipolar transistor type semiconductor device comprising:
   at least one cell comprising a base region of a first conductivity type having disposed therein at least one emitter region of a second conductivity type;
   a first well region of a second conductivity type;
   a second well region of a first conductivity type;
   a drift region of a second conductivity type;
   a collector region of a first conductivity type;
   a collector contact;
   wherein each cell is disposed within the first well region and the first well region is disposed within the second well region; the device further comprising:
      a first gate disposed over a base region so that a MOSFET channel can be formed between an emitter region and the first well region; the device further comprising:
         a second gate disposed over the second well region so that a MOSFET channel can be formed between the first well region and the drift region;
         wherein the device is configured such that during operation of the device a depletion region at a junction between the base region and the first well region can extend to a junction between the first well region and the second well region, thereby substantially isolating the potential of the first well region from any increase in the potential of the collector contact so that the device can be turned off without having to form a MOSFET channel between the base region and the second well region; and
         wherein an on-state conduction proceeds through a thyristor comprising at least said first well region, said second well region, said drift region, and said collector region.

8. An emitter switched thyristor semiconductor device comprising:
   at least one cell comprising a base region of a first conductivity type having disposed therein at least one emitter region of a second conductivity type;

a first well region of a second conductivity type;

a second well region of a first conductivity type;

a drift region of a second conductivity type;

a collector region of a first conductivity type;

a collector contact; and a heavily doped isolation region of said first conductivity type which is in contact with said second well region and in direction electrical contact with at least said base region and at least said emitter region;

wherein each cell is disposed within the first well region and the first well region is disposed within the second well region; the device further comprising:

a first gate disposed over a base region so that a MOSFET channel can be formed between the first well region and the drift region; and wherein the device is configured such that during operation of the device a depletion region at a junction between the base region and the first well region can extend to a junction between the first well region and the second well region, thereby substantially isolating the potential of the first well region from any increase in the potential of the collector contact so that the device can be turned off without having to form a MOSFET channel between the base region and the second well region.

9. An insulated base emitter switched thyristor type semiconductor device comprising:

at least one cell comprising a base region of a first conductivity type having disposed therein at least one emitter region of a second conductivity type;

a first well region of a second conductivity type;

a second well region of a first conductivity type;

a drift region of a second conductivity type;

a collector region of a first conductivity type;

a collector contact;

a heavily doped isolation region of said first conductivity type which is in contact with said second well region and in direction electrical contact with at least said base region and at least said emitter region;

wherein each cell is disposed within the first well region and the first well region is disposed within the second well region; the device further comprising:

a first gate disposed over a base region so that a MOSFET channel can be formed between the first well region and the drift region; and wherein the device is configured such that during operation of the device a depletion region at a junction between the base region and the first well region can extend to a junction between the first well region and the second well region, thereby substantially isolating the potential of the first well region from any increase in the potential of the collector contact so that the device can be turned off without having to form a MOSFET channel between the base region and the second well region.

10. The semiconductor device according to claim 1 in which the extension of the depletion region to a junction between the first well region and the second well region substantially isolates the potential of the first well region from any increase in the potential of the collector contact so as to protect the cell.

11. The insulated gate bipolar transistor type semiconductor device according to claim 7 configured so that a potential at the second well region follows a potential applied at the collector contact to turn on the device restricting any snap-back in the forward conducting mode.

12. A method of operating a semiconductor device comprising the steps of: providing a semiconducting device comprising:

at least one cell comprising a base region of a first conductivity type having disposed therein at least one emitter region of a second conductivity type;

a first well region of a second conductivity type;

a second well region of a first conductivity type;

a drift region of a second conductivity type;

a collector region of a first conductivity type; and a collector contact;

in which each cell is disposed within the first well region and the first well region is disposed within the second well region; the device further comprising:

a first gate disposed over a base region so that a MOSFET channel can be formed between an emitter region and the first well region; the device further comprising:

a second gate disposed over the second well region so that a MOSFET channel can be formed between the first well region and the drift region;

forming the MOSFET channel between the emitter region and the first well region;

forming the MOSFET channel between the first well region and the drift region; and operating the device so that a depletion region is formed at a junction between the base region and the first well region which extends to a junction between the first well region and the second well region, thereby substantially isolating the potential of the first well region from any increase in the potential of the collector contact;

turning off the device without forming a MOSFET channel between the base region and the second well region.

* * * * *